(12) United States Patent
Feng et al.

(10) Patent No.: US 11,869,411 B2
(45) Date of Patent: Jan. 9, 2024

(54) DISPLAY SUBSTRATE, MANUFACTURING METHOD THEREOF, AND DISPLAY DEVICE

(71) Applicants: HEFEI BOE JOINT TECHNOLOGY CO., LTD., Anhui (CN); BOE TECHNOLOGY GROUP CO., LTD., Beijing (CN)

(72) Inventors: Xuehuan Feng, Beijing (CN); Yongqian Li, Beijing (CN); Dacheng Zhang, Beijing (CN); Lang Liu, Beijing (CN)

(73) Assignees: HEFEI BOE JOINT TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 407 days.

(21) Appl. No.: 17/044,190

(22) PCT Filed: Dec. 20, 2019

(86) PCT No.: PCT/CN2019/126930
§ 371 (c)(1),
(2) Date: Sep. 30, 2020

(87) PCT Pub. No.: WO2021/120166
PCT Pub. Date: Jun. 24, 2021

(65) Prior Publication Data
US 2023/0103377 A1 Apr. 6, 2023

(51) Int. Cl.
*G09G 3/20* (2006.01)
*H01L 27/12* (2006.01)

(52) U.S. Cl.
CPC ....... *G09G 3/2092* (2013.01); *H01L 27/1251* (2013.01); *H01L 27/1255* (2013.01);
(Continued)

(58) Field of Classification Search
CPC ............ H01L 23/5223; H01L 23/5383; H01L 2924/3025; H01L 28/40; H01L 23/642;
(Continued)

(56) References Cited

U.S. PATENT DOCUMENTS 7,626,199 B2 * 12/2009 Kim .................... H01L 27/1255
313/504
2004/0041518 A1 * 3/2004 Yoneda ................ H10K 50/865
313/506
(Continued)

FOREIGN PATENT DOCUMENTS

CN 101431053 A 5/2009
CN 101442038 A 5/2009
(Continued)

OTHER PUBLICATIONS

Extended European Search Report for Application No. 19946249.0-1020, dated Dec. 9, 2022, 8 pages.
(Continued)

*Primary Examiner* — Lunyi Lao
*Assistant Examiner* — Kebede T Teshome
(74) *Attorney, Agent, or Firm* — BROOKS KUSHMAN P.C.

(57) ABSTRACT

A display substrate includes: a base substrate; a first conductive pattern arranged on the base substrate; a first insulation layer arranged at a side of the first conductive pattern away from the base substrate; a second conductive pattern arranged at a side of the first insulation layer away from the base substrate; a second insulation layer arranged at a side of the second conductive pattern away from the base substrate; and a third conductive pattern arranged at a side of the second insulation layer away from the base substrate. The third conductive pattern and the first conductive pattern together serve as a first electrode plate of the capacitor, and
(Continued)

the second conductive pattern serves as a second electrode plate of the capacitor.

17 Claims, 8 Drawing Sheets

(52) U.S. Cl.
CPC ............... *G09G 2300/0842* (2013.01); *G09G 2310/0267* (2013.01)

(58) Field of Classification Search
CPC ............ H01G 4/30; H01G 4/005; H01G 9/10; G09G 2310/0286; G09G 2310/0243; G09G 2310/0289; G09G 3/3677; G09G 2310/0264; G09G 2310/027; G09G 3/3266
See application file for complete search history.

(56) References Cited

U.S. PATENT DOCUMENTS

| | | | |
|---|---|---|---|
| 2005/0258466 A1* | 11/2005 | Kwak | ..................... H01L 28/60 257/532 |
| 2006/0121310 A1 | 6/2006 | Sun | |
| 2011/0007049 A1 | 1/2011 | Kikuchi et al. | |
| 2018/0031894 A1 | 2/2018 | Kim et al. | |
| 2018/0122323 A1* | 5/2018 | Park | ..................... H01L 29/7869 |
| 2018/0197897 A1 | 7/2018 | Xin et al. | |
| 2018/0212008 A1 | 7/2018 | Tang | |
| 2019/0214504 A1* | 7/2019 | Song | ..................... H01L 27/124 |
| 2020/0243034 A1* | 7/2020 | Gu | ........................ G09G 3/3677 |

FOREIGN PATENT DOCUMENTS

| | | |
|---|---|---|
| CN | 104297970 A1 | 1/2015 |
| CN | 105428369 A1 | 3/2016 |
| CN | 106654048 A | 5/2017 |
| CN | 108257977 A | 7/2018 |
| CN | 108257997 A | 7/2018 |
| CN | 110221492 A | 9/2019 |
| CN | 110223623 A | 9/2019 |
| CN | 110264937 A | 9/2019 |
| JP | 2018018082 A | 2/2018 |
| WO | 2009150864 A1 | 12/2009 |

OTHER PUBLICATIONS

First Office Action for Japanese Application No. 2021-564466, dated Aug. 17, 2023, 10 Pages.

* cited by examiner

DISPLAY SUBSTRATE, MANUFACTURING METHOD THEREOF, AND DISPLAY DEVICE

CROSS-REFERENCE TO RELATED APPLICATION

This application is the U.S. national phase of PCT Application No. PCT/CN2019/126930 filed on Dec. 20, 2019, which is incorporated herein by reference in its entirety.

TECHNICAL FIELD

The present disclosure relates to the field of display technology, in particular to a display substrate, a manufacturing method thereof, and a display device.

BACKGROUND

Along with the development of science and technology as well as the growth in people's living standard, the requirement on display increases continuously. In order to meet customer's requirements, many manufacturers have started to design display devices having a resolution of 8K or more. However, the 8K display device is very scarce in the market. This is because it is difficult to develop a Gate Driver on Array (GOA) suitable for the 8K display device.

In the related art, a Pixel Per Inch (PPI) increases along with an increase in the resolution, so a layout space of the other portions in the display device may be restrained.

SUMMARY

An object of the present disclosure is to provide a display substrate, a manufacturing method and a display device, so as to solve the above-mentioned problem.

In one aspect, the present disclosure provides in some embodiments a display substrate, including: a base substrate; a first conductive pattern arranged on the base substrate and including a peripheral portion and a first portion and a second portion surrounded by the peripheral portion; a first insulation layer arranged at a side of the first conductive pattern away from the base substrate and covering the first conductive pattern; a second conductive pattern arranged at a side of the first insulation layer away from the base substrate, an orthogonal projection of the second conductive pattern onto the base substrate coinciding with an orthogonal projection of the first portion of the first conductive pattern onto the base substrate; a second insulation layer arranged at a side of the second conductive pattern away from the base substrate and covering the second conductive pattern; and a third conductive pattern arranged at a side of the second insulation layer away from the base substrate and including a first portion and a second portion, an orthogonal projection of the first portion of the third conductive pattern onto the base substrate being located within the orthogonal projection of the second conductive pattern onto the base substrate, an orthogonal projection of the second portion of the third conductive pattern onto the base substrate overlapping an orthogonal projection of the second portion of the first conductive pattern onto the base substrate at an overlapping region, and the third conductive pattern being electrically connected to the first conductive pattern through a via-hole at the overlapping region. The first conductive pattern, the first insulation layer, the second conductive pattern, the second insulation layer and the third conductive pattern together form a capacitor of a GOA unit in the display substrate. The third conductive pattern and the first conductive pattern together serve as a first electrode plate of the capacitor, and the second conductive pattern serves as a second electrode plate of the capacitor.

In a possible embodiment of the present disclosure, the third conductive pattern is made of a metal material.

In a possible embodiment of the present disclosure, the display substrate includes a light-shielding layer made of a conductive material. And the light-shielding layer and the first conductive pattern are in a same layer and made of a same material.

In a possible embodiment of the present disclosure, an output circuitry of the GOA unit includes an output transistor and the capacitor, the first electrode plate of the capacitor is connected to a control electrode of the output transistor, the second electrode plate of the capacitor is connected to a second electrode of the output transistor, and the output transistor is configured to output a clock signal under the control of a pull-up signal.

In a possible embodiment of the present disclosure, the GOA unit includes at least two output circuitries, and the second conductive patterns of the capacitors in the at least two output circuitries are the same.

In a possible embodiment of the present disclosure, the GOA unit further includes a noise reduction circuitry, one end of which is connected to an output end of the output circuitry and the other end of which is connected to a low level signal line.

In a possible embodiment of the present disclosure, the noise reduction circuitry includes a first noise reduction transistor and a second noise reduction transistor, the first noise reduction transistor is configured to pull down a potential at the output end of the output circuitry under the control of a first pull-down signal, the second noise reduction transistor is configured to pull down the potential at the output end of the output circuitry under the control of a second pull-down signal, the first pull-down signal and the second pull-down signal are outputted alternately.

In a possible embodiment of the present disclosure, an outer contour of the capacitor in the GOA unit is a rectangle, a lengthwise direction of the rectangle is parallel to a row direction of the display substrate, a widthwise direction of the rectangle is parallel to a column direction of the display substrate, and a ratio of a length of the rectangle to a width of the rectangle is greater than 5.

In a possible embodiment of the present disclosure, the GOA unit includes two capacitors, first long sides of the two capacitors are located on a straight line, and second long sides of the two capacitors are located on another straight line.

In a possible embodiment of the present disclosure, the output circuitries of two adjacent GOA units in the display substrate are arranged symmetrically relative to a line extending in a direction parallel to the row direction of the display substrate.

In another aspect, the present disclosure provides in some embodiments a display device including the above-mentioned display substrate.

In yet another aspect, the present disclosure provides in some embodiments a method for manufacturing a display substrate, including: providing a base substrate; forming a first conductive pattern on the base substrate, the first conductive pattern including a peripheral portion and a first portion and a second portion surrounded by the peripheral portion; forming a first insulation layer covering the first conductive pattern; forming a second conductive pattern at a side of the first insulation layer away from the base substrate, an orthogonal projection of the second conductive pattern onto the base substrate coinciding with an orthogonal projection of the first portion of the first conductive pattern onto the base substrate; forming a second insulation layer covering the second conductive pattern; forming a via-hole penetrating through the first insulation layer and the second insulation layer, an orthogonal projection of the via-hole onto the base substrate being located within an orthogonal projection of the second portion of the first conductive pattern onto the base substrate; and forming a third conductive pattern at a side of the second insulation layer away from the base substrate, the third conductive pattern including a first portion and a second portion, an orthogonal projection of the first portion of the third conductive pattern onto the base substrate being located within the orthogonal projection of the second conductive pattern onto the base substrate, the second portion of the third conductive pattern covering the via-hole, and the third conductive pattern being electrically connected to the first conductive pattern through the via-hole.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

In the related art, during the manufacture of a display substrate, such a phenomenon as short circuit easily occurs for a capacitor when two electrode plates of the capacitor are connected to each other, and at this time a circuitry in the display substrate may fail.

An object of the present disclosure is to provide a display substrate, a manufacturing method and a display device, so as to, as compared with the related art, prevent the occurrence of the short circuit for the capacitor acquired during the manufacture of the display substrate when two electrode plates of the capacitor are connected to each other, thereby to prevent the occurrence of a failure of the circuitry in the display substrate.

Figure 1:
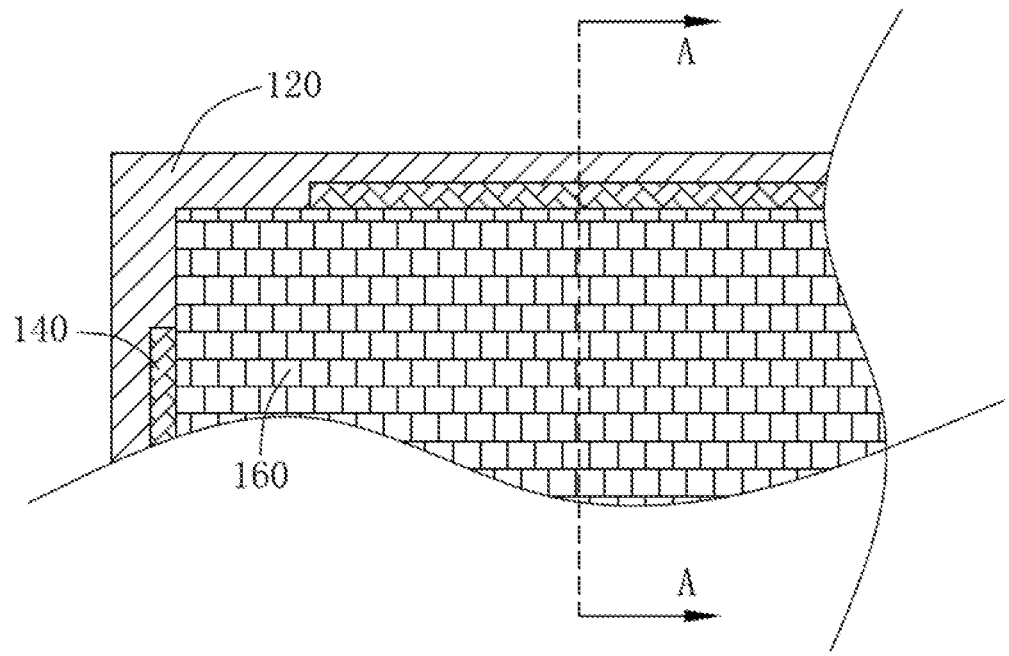
FIG. 1 is a top view of a display substrate according to an embodiment of the present disclosure.
Figure 2:
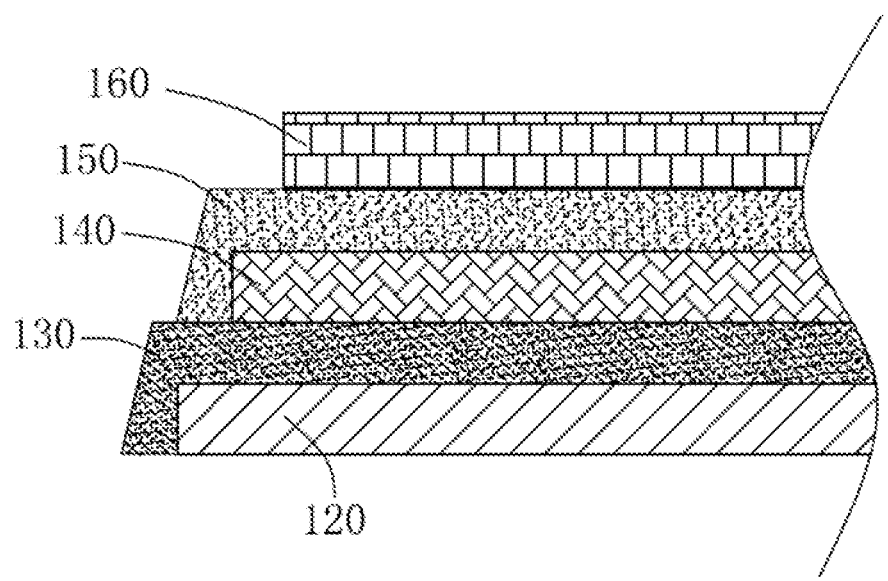
FIG. 2 is a sectional view of the display substrate along line A-A in FIG. 3.
Figure 3:
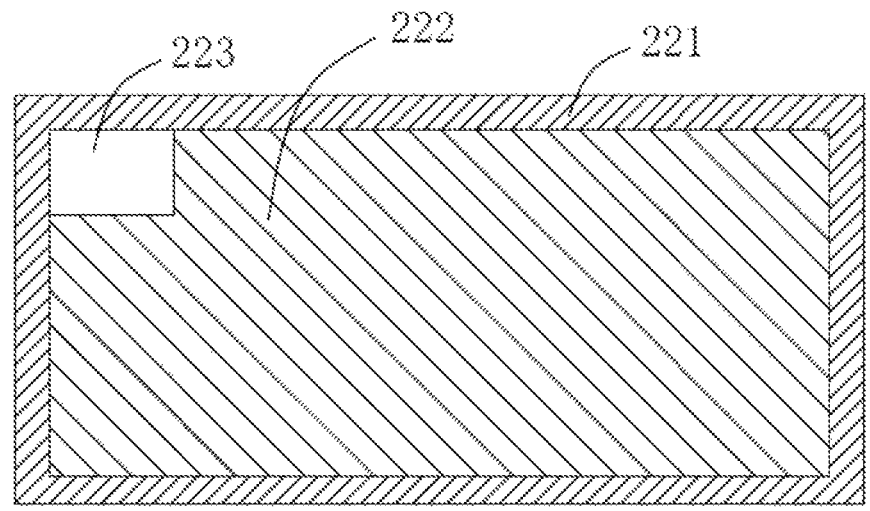
FIG. 3 is a schematic view showing an orthogonal projection of each portion of a first conductive pattern in the display substrate onto a base substrate according to an embodiment of the present disclosure.

The present disclosure provides in some embodiments a display substrate which, as shown in FIGS. 1 to 3, includes: a base substrate (not shown); a first conductive pattern 120 arranged on the base substrate and including a peripheral portion and a first portion and a second portion surrounded by the peripheral portion; a first insulation layer 130 arranged at a side of the first conductive pattern 120 away from the base substrate and covering the first conductive pattern 120; a second conductive pattern 140 arranged at a side of the first insulation layer 130 away from the base substrate, an orthogonal projection of the second conductive pattern 140 onto the base substrate coinciding with an orthogonal projection of the first portion of the first conductive pattern 120 onto the base substrate; a second insulation layer 150 arranged at a side of the second conductive pattern 140 away from the base substrate and covering the second conductive pattern 140; and a third conductive pattern 160 arranged at a side of the second insulation layer 150 away from the base substrate and including a first portion and a second portion, an orthogonal projection of the first portion of the third conductive pattern 160 onto the base substrate being located within the orthogonal projection of the second conductive pattern 140 onto the base substrate, an orthogonal projection of the second portion of the third conductive pattern 160 onto the base substrate overlapping an orthogonal projection of the second portion of the first conductive pattern 120 onto the base substrate at an overlapping region, and the third conductive pattern 160 being electrically connected to the first conductive pattern 120 through a via-hole at the overlapping region. The first conductive pattern 120, the first insulation layer 130, the second conductive pattern 140, the second insulation layer 150 and the third conductive pattern 160 together form a capacitor of a GOA unit in the display substrate. The third conductive pattern 160 and the first conductive pattern 120 together serve as a first electrode plate of the capacitor, and the second conductive pattern 140 serves as a second electrode plate of the capacitor.

According to the embodiments of the present disclosure, the orthogonal projection of the second conductive pattern onto the base substrate may coincide with the orthogonal projection of the first portion of the first conductive pattern surrounded by the peripheral portion onto the base substrate, so as to reduce the probability of an electrical connection between the second conductive pattern and the first conductive pattern when a gap occurs in the first insulation layer.

Identically, the orthogonal projection of the first portion of the third conductive pattern onto the base substrate may be located within the orthogonal projection of the second conductive pattern onto the base substrate, so as to reduce the probability of an electrical connection between the third conductive pattern and the second conductive pattern when a gap occurs in the second insulation layer. As a result, it is able to improve the yield of the capacitor. In addition, the capacitor in the GOA unit is designed with three layers, so as to reduce a space occupied by the capacitor while ensuring a capacitance, thereby to reduce a layout space of the GOA unit. Hence, according to the embodiments of the present disclosure, it is able to improve the yield of the capacitor, reduce the space occupied by the capacitor, and reduce the layout space of the GOA unit.

The base substrate may be a rigid base substrate or flexible base substrate. When the base substrate is a rigid base substrate, it may be a quartz or glass substrate. And when the base substrate is a flexible base substrate, it may be a polyimide thin film.

In the embodiments of the present disclosure, the capacitor may be of a three-layer structure.

The first conductive pattern 120 may include the peripheral portion, the first portion and the second portion, as shown in FIG. 3. In FIG. 3, reference numeral 221 represents an orthogonal projection of the peripheral portion of the first conductive pattern 120 onto the base substrate, reference numeral 222 represents the orthogonal projection of the first portion of the first conductive pattern 120 onto the base substrate, and reference numeral 223 represents the orthogonal projection of the second portion of the first conductive pattern 120 onto the base substrate. The orthogonal projection of the second conductive pattern 140 onto the base substrate may coincide with the orthogonal projection 222 of the first portion of the first conductive pattern 120 onto the base substrate, so as to prevent the second conductive pattern 140 from being electrically connected to the first conductive pattern 120 through a gap in the first insulation layer 130 covering the peripheral portion of the first conductive pattern 120, thereby to prevent the failure of the capacitor.

The first conductive pattern 120 and the second conductive pattern 140 may each be made of a metal material, or any other conductive material. Here, a specific material of them will not be particularly defined.

The first insulation layer 130 may be made of an organic insulation material, or an inorganic insulation material. Here, a specific material of the first insulation layer 130 will not be particularly defined herein.

Figure 4:
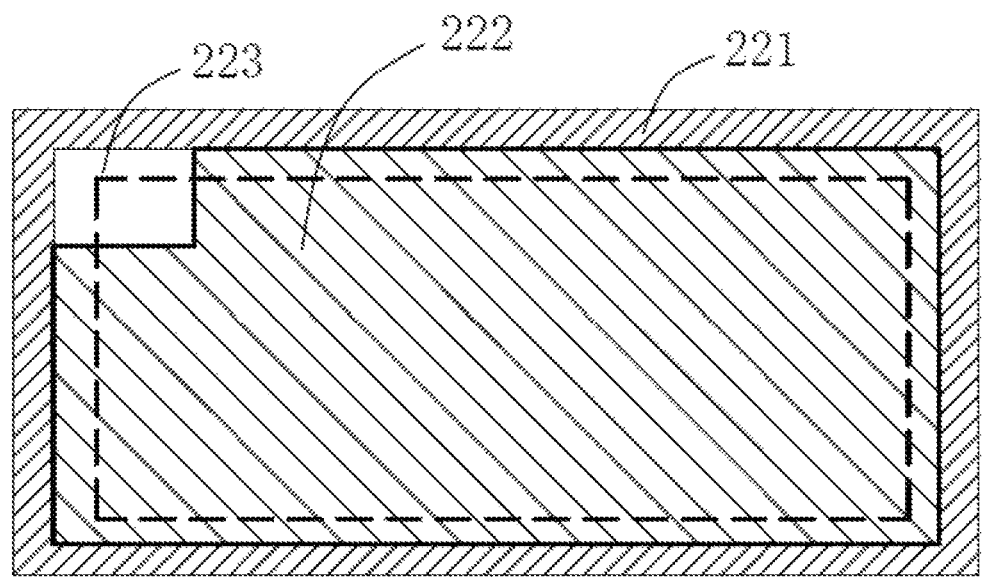
FIG. 4 is a schematic view showing an orthogonal projection of each of a second conductive pattern and a third conductive pattern in the display substrate onto the base substrate according to an embodiment of the present disclosure.

A contour of the orthogonal projection of the second conductive pattern 140 onto the base substrate is shown by a bold solid line in FIG. 4. The second conductive pattern 140 may not be in contact with the first insulation layer 130 through a bending gap at the peripheral portion, so it is able to prevent the second conductive pattern 120 from being electrically connected to the first conductive pattern 120 through the gap at a bending portion of the first insulation layer 130, thereby to ensure the insulation performance between the first conductive pattern 120 and the second conductive pattern 140, and improve the yield of the capacitor.

A contour of the orthogonal projection of the third conductive pattern 160 onto the base substrate is shown by a bold dotted line in FIG. 4.

Figure 5:
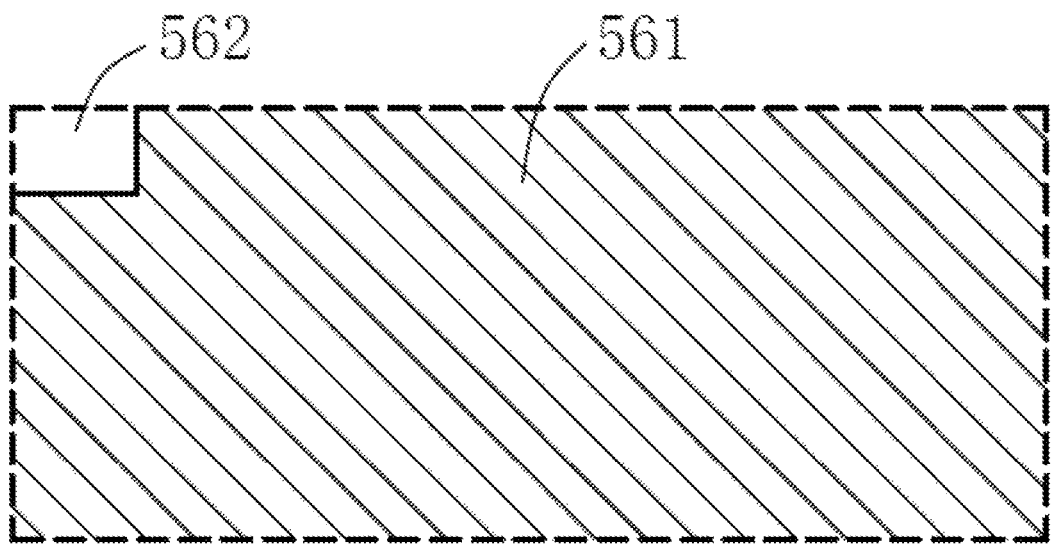
FIG. 5 is a schematic view showing an orthogonal projection of each portion of the third conductive pattern in the display substrate onto the base substrate according to an embodiment of the present disclosure.

The third conductive pattern 160 may include the first portion and the second portion. In FIG. 5, reference numeral 561 represents the orthogonal projection of the first portion of the third conductive pattern 160 onto the base substrate. The orthogonal projection of the first portion of the third conductive pattern 160 onto the base substrate may be located within the orthogonal projection of the second conductive pattern 140 onto the base substrate, so as to prevent the first portion of the third conductive pattern 160 from being electrically connected to the second conductive pattern 140 through a gap at a bending portion of the second insulation layer 150, thereby to ensure the insulation performance between the third conductive pattern 160 and the second conductive pattern 140, and improve the yield of the capacitor.

As shown in FIGS. 3 to 5, the orthogonal projection 562 of the second portion of the third conductive pattern 160 onto the base substrate may overlap the orthogonal projection 223 of the second portion of the first conductive pattern 120 onto the base substrate at the overlapping region. Hence, the third conductive pattern 160 may be electrically connected to the first conductive pattern 120 through a via-hole formed in the overlapping region and penetrating through the first insulation layer 130 and the second insulation layer 150.

The third conductive pattern 160 may be made of a metal material or any other conductive material. Here, a specific material of the third conductive pattern 160 will not be particularly defined herein.

The second insulation layer 150 may be made of an organic insulation material or an inorganic insulation material. Here, a specific material of the second insulation layer 150 will not be particularly defined herein.

The second conductive pattern 140 may be arranged in such a manner as to face the first portion of the third conductive pattern 160 and face the first portion of the first conductive pattern 120. Through applying voltages to the second conductive pattern 140 and the third conductive pattern 160, an internal electric field may be generated between the second conductive pattern 140 and the first portion of the third conductive pattern 160, so as to store charges. In addition, the third conductive pattern 160 may be electrically connected to the first conductive pattern 120, so an internal electric field may also be formed between the second conductive pattern 140 and the first portion of the first conductive pattern 160, so as to store charges.

The charges may be stored at both sides of the second conductive pattern 140, so it is able to reduce an area of the second conductive pattern 140 while ensuring a charge storage amount, thereby to reduce an area of the capacitor. In the embodiments of the present disclosure, the capacitor may be used for the GOA unit in the display substrate, so as to reduce the area of the capacitor in the GOA unit, thereby to reduce the layout space of the GOA unit.

The display substrate may further include a TFT array layer, and a gate electrode in the TFT array layer and the second conductive pattern are in a same layer and made of a same material.

In the embodiments of the present disclosure, when the gate electrode in the TFT array layer and the second conductive pattern 140 are in a same layer and made of a same material, it is unnecessary to form the second conductive pattern 140 separately, thereby to reduce the manufacture cost of the display substrate and reduce a thickness of the display substrate.

The display substrate may further include a light-shielding (LS) layer. The light-shielding layer may be made of a conductive material, and the light-shielding layer and the first conductive pattern 120 are in a same layer and made of a same material.

In the embodiments of the present disclosure, the LS layer may be arranged on the base substrate so as to shield an active layer and prevent a characteristic of the active layer from being adversely affected by a light beam passing through the base substrate toward the active layer, thereby to prevent a TFT from being adversely affected by the light beam.

In the embodiments of the present disclosure, when the LS layer and the first conductive pattern 120 are in a same layer and made of a same material, it is unnecessary to form the first conductive pattern 120 separately, thereby to reduce the manufacture cost of the display substrate and reduce a thickness of the display substrate.

In addition, in some other embodiments of the present disclosure, a metal layer at a side of the second conductive pattern 140 away from the base substrate, e.g., a source/drain metal layer, and the third conductive pattern 160 are in a same layer and made of a same material. In this way, it is unnecessary to form the third conductive pattern 160 separately, thereby to reduce the manufacture cost of the display substrate and reduce a thickness of the display substrate.

Further, an output circuitry of the GOA unit may include an output transistor and the above-mentioned capacitor. A control electrode (gate electrode) of the output transistor may be connected to a pull-up node, a first electrode thereof may be connected to a driving signal source, and a second electrode thereof may be connected to a pixel driving circuitry. The first electrode plate of the capacitor may be connected to the control electrode (gate electrode) of the output transistor, and the second electrode plate of the capacitor may be connected to the second electrode of the output transistor. The output transistor is configured to output a driving signal to the pixel driving circuitry under the control of a potential of a pull-up signal.

There is no voltage leap at each end of the capacitor, so through the capacitor, it is able to increase a voltage applied to the control electrode (gate electrode) of the output transistor when the second electrode of the output transistor outputs a high level signal.

Further, there may exist at least two output circuitries in the GOA unit. The second conductive patterns of the capacitors in the at least two output circuitries may be the same, i.e., they may be formed integrally.

Figure 6:
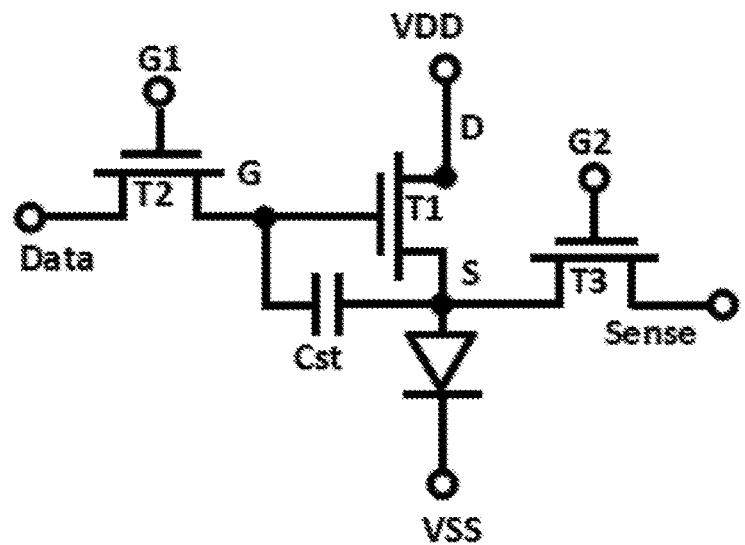
FIG. 6 is a schematic view showing a pixel driving circuit in the display substrate according to an embodiment of the present disclosure.

In the embodiments of the present disclosure, FIG. 6 shows the pixel driving circuitry in the display substrate of a 3T1C structure. At this time, the GOA unit needs to provide two sets of output signals.

Figure 7:
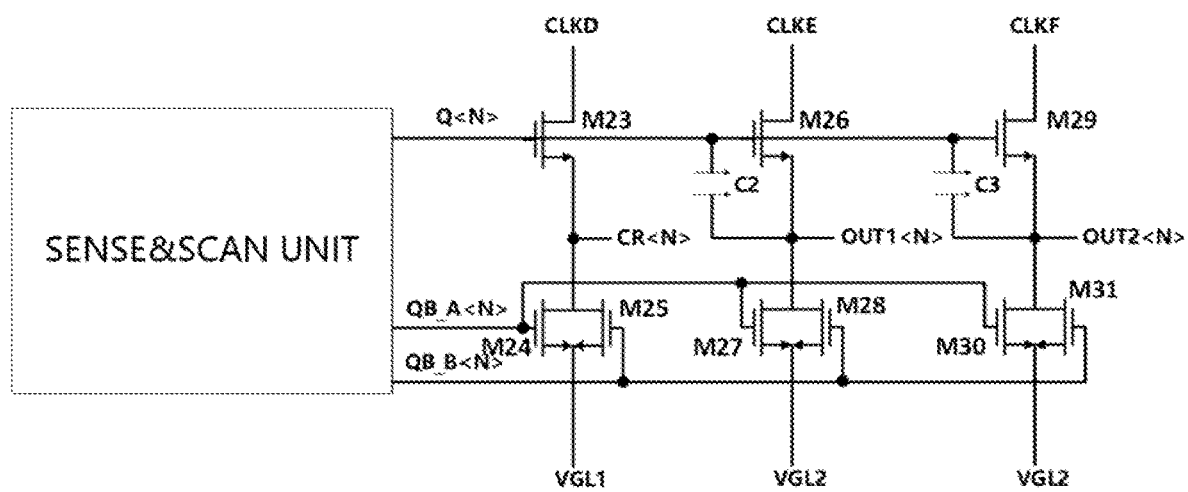
FIG. 7 is a schematic view showing a GOA unit in the display substrate according to an embodiment of the present disclosure.
Figure 8:
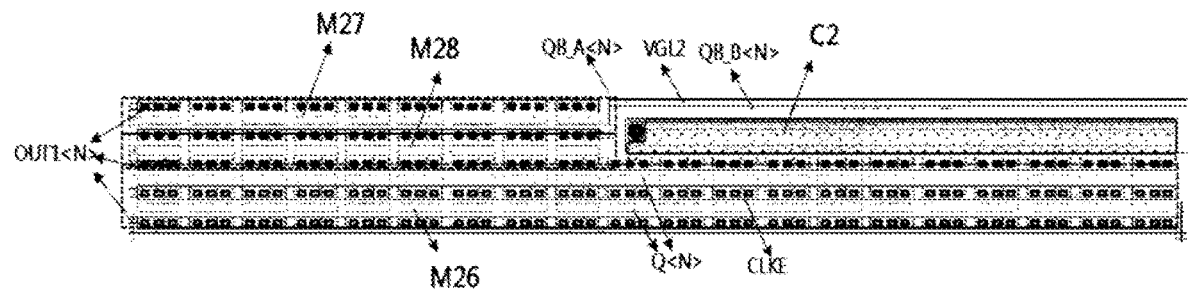
FIG. 8 is a schematic view showing a layout design of elements in FIG. 7.

At this time, FIG. 7 and FIG. 8 each shows the output circuitry in the GOA unit, i.e., the output transistors may be a first output transistor M26 and a second output transistor M29 in FIG. 7, and the capacitors may be a first capacitor C2 and a second capacitor C3 in FIG. 7.

A control electrode (gate electrode) of the first output transistor M26 may be electrically connected to a pull-up node Q<N>, a first electrode of the first output transistor M26 may be electrically connected to a first clock signal line CLKE, and a second electrode of the first output transistor M26 may be electrically connected to a control electrode (gate electrode) of a transistor T2 in the pixel driving circuitry in FIG. 6. A first electrode plate of the first capacitor C2 may be electrically connected to the control electrode (gate electrode) of the first output transistor M26, and a second electrode plate of the first capacitor C2 may be electrically connected to the second electrode of the first output transistor M26.

A control electrode (gate electrode) of the second output transistor M29 may be electrically connected to the pull-up node Q<N>, a first electrode thereof may be electrically connected to a second clock signal line CLKF, and a second electrode thereof may be electrically connected to a control electrode (gate electrode) of a transistor T3 in the pixel driving circuitry in FIG. 6. A first electrode plate of the second capacitor C3 may be electrically connected to the control electrode (gate electrode) of the second output transistor M29, and a second electrode plate of the second capacitor C3 may be electrically connected to the second electrode of the second output transistor M29.

The first output transistor M26 may control the first electrode of the first output transistor M26 to be electrically connected to the second electrode of the first output transistor M26 under the control of a pull-up signal from the pull-up node Q<N>, so as to output a first clock signal from the first clock signal line CLKE to the control electrode (gate electrode) of the transistor T2. In addition, the second output transistor M29 may control the first electrode of the second output transistor M29 to be electrically connected to the second electrode of the second output transistor M29 under the control of the pull-up signal from the pull-up node Q<N>, so as to output a second clock signal from the second clock signal line CLKF to the control electrode (gate electrode) of the transistor T3.

High levels of the first clock signal and the second clock signal may be arranged alternately within different time periods, so as to turn on T2 and T3 in FIG. 7 alternately, thereby to perform the display through a pixel circuitry and detect an external compensation voltage for the pixel circuitry in a time-division manner.

Figure 9:
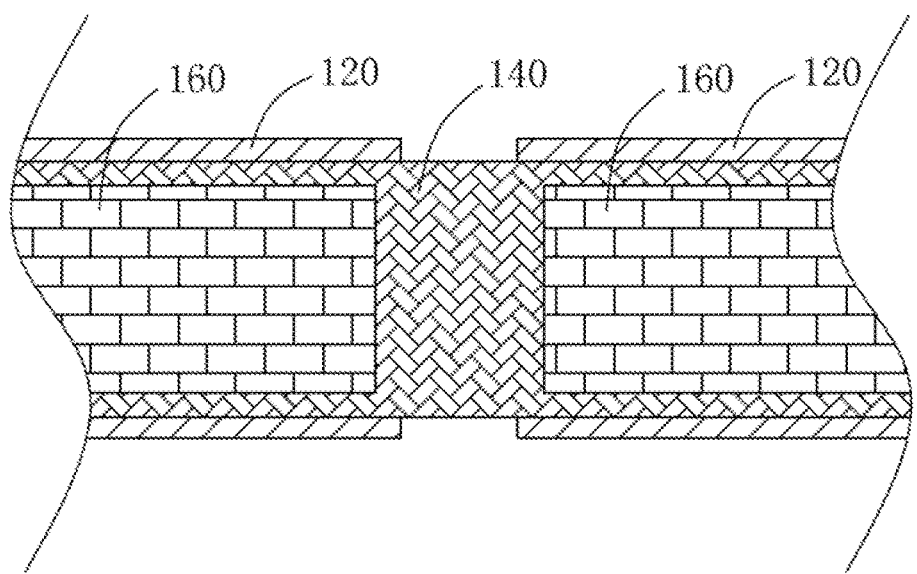
FIG. 9 is a schematic view showing a situation where the second conductive pattern is shared by two capacitors in the display substrate according to an embodiment of the present disclosure.

As shown in FIG. 9, the second conductive pattern 140 of the first capacitor C2 and the second conductive pattern 140 of the second capacitor C3 may be the same second conductive pattern 140.

When the gate electrode in the TFT array layer and the second conductive pattern 140 are in a same layer and made of a same material, as shown in FIG. 7, the pull-up node Q<N> may be connected to the gate electrode of the first output transistor M26 and the gate electrode of the second output transistor M29, and also connected to the first electrode plate of the first capacitor C2 and the first electrode plate of the second capacitor C3. Hence, in FIG. 10, a lead created from metal material of a gate electrode layer may serve as the gate electrode of the first output transistor M26 and the gate electrode of the second output transistor M29, and also serve as the first electrode plate of the capacitor C2 and the first electrode plate of the capacitor C3. In other words, the second conductive patterns 140 of the first capacitor C2 and the second capacitor C3 may be the same gate electrode layer, i.e., may be of an integral structure.

In this regard, it is able to reduce the manufacture cost of the capacitor in the GOA unit as well as the thickness of the display substrate.

Figure 10:
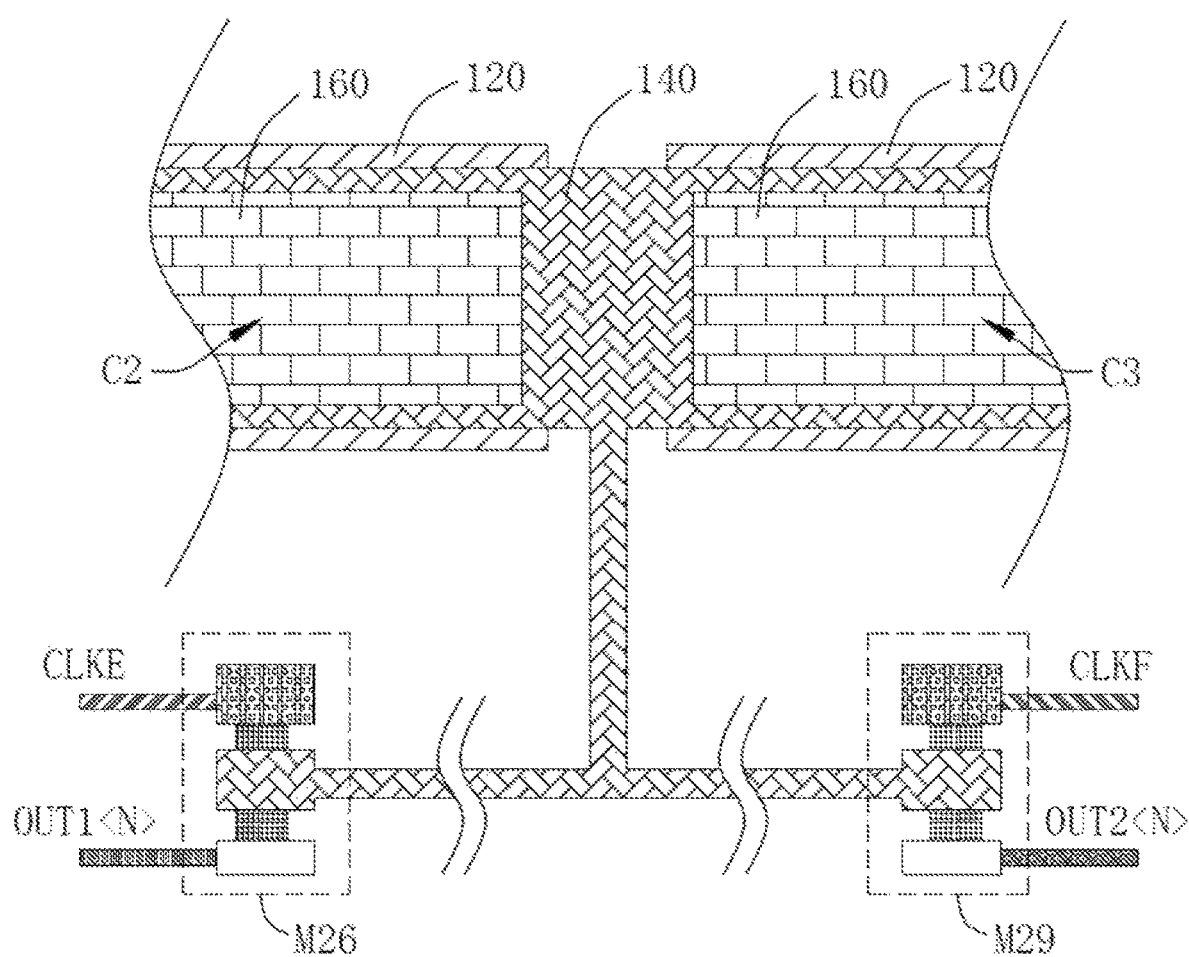
FIG. 10 is a schematic view showing a situation where a gate electrode is shared by two capacitors in the display substrate according to an embodiment of the present disclosure.

To be specific, as shown in FIG. 10, two capacitors may be arranged close to each other, and one gate electrode layer may serve as the electrode plates of the two capacitors, so as to further optimize of the layout design of the GOA unit.

As shown in FIG. 7, the GOA unit may further include a noise reduction circuitry, a first end of which is connected to an output end of the output circuitry and a second end of which is connected to a low level signal line. The noise reduction circuitry is configured to pull down a potential at the output end of the output circuitry under the control of the potential at the pull-down node, so as to reduce a noise.

The noise reduction circuitry may control the output end of the output circuitry to be electrically connected to the low level signal line under the control of the potential at the pull-down node, so as to pull down the potential at the output end of the output circuitry.

Further, the noise reduction circuitry may include a first noise reduction transistor and a second noise reduction transistor. The first noise reduction transistor is configured to pull down the potential at the output end of the output circuitry for the purpose of noise reduction under the control of a first pull-down signal, the second noise reduction transistor is configured to pull down the potential at the output end of the output circuitry for the purpose of noise reduction under the control of a second pull-down signal, the first pull-down signal and the second pull-down signal may be outputted alternately.

As shown in FIG. 7, a noise reduction circuitry for pulling down a potential at the second electrode of the first output transistor M26 may include a first noise reduction transistor M27 and a second noise reduction transistor M28. A control electrode of the first noise reduction transistor M27 may be connected to a first pull-down node QB_A<N>, a first electrode thereof may be connected to the second electrode of the first output transistor M26, and a second electrode thereof may be connected to a low level signal line VGL. A control electrode of the second noise reduction transistor M28 may be connected to a second pull-down node QB_B<N>, a first electrode thereof may be connected to the second electrode of the first output transistor M26, and a second electrode thereof may be connected to the low level signal line VGL.

In the embodiments of the present disclosure, through the first noise reduction transistor M27 and the second noise reduction transistor M28, it is able to pull down the potential at the second electrode of the first output transistor M26, thereby to reduce the noise. However, when a voltage is applied to a transistor for a long time period, a failure may occur. The first pull-down signal applied to the first pull-down node QB_A<N> and the second pull-down signal applied to the second pull-down node QB_B<N> may be outputted alternately, so as to pull down the potential at the second electrode of the first output transistor M26 through the first noise reduction transistor M27 and the second noise reduction transistor M28 alternately, and prevent the occurrence of the failure when the individual transistor operates for a long time period, thereby to improve the reliability of the GOA unit.

Identically, a noise reduction circuitry for pulling down the potential at the second electrode of the second output transistor M29 may include a third noise reduction transistor M30 and a fourth noise reduction transistor M31. Operating modes of the third noise reduction transistor M30 and the fourth noise reduction transistor M31 may be the same as those of the first noise reduction transistor M27 and the second noise reduction transistor M28, and thus will not be particularly defined herein.

Figure 11:
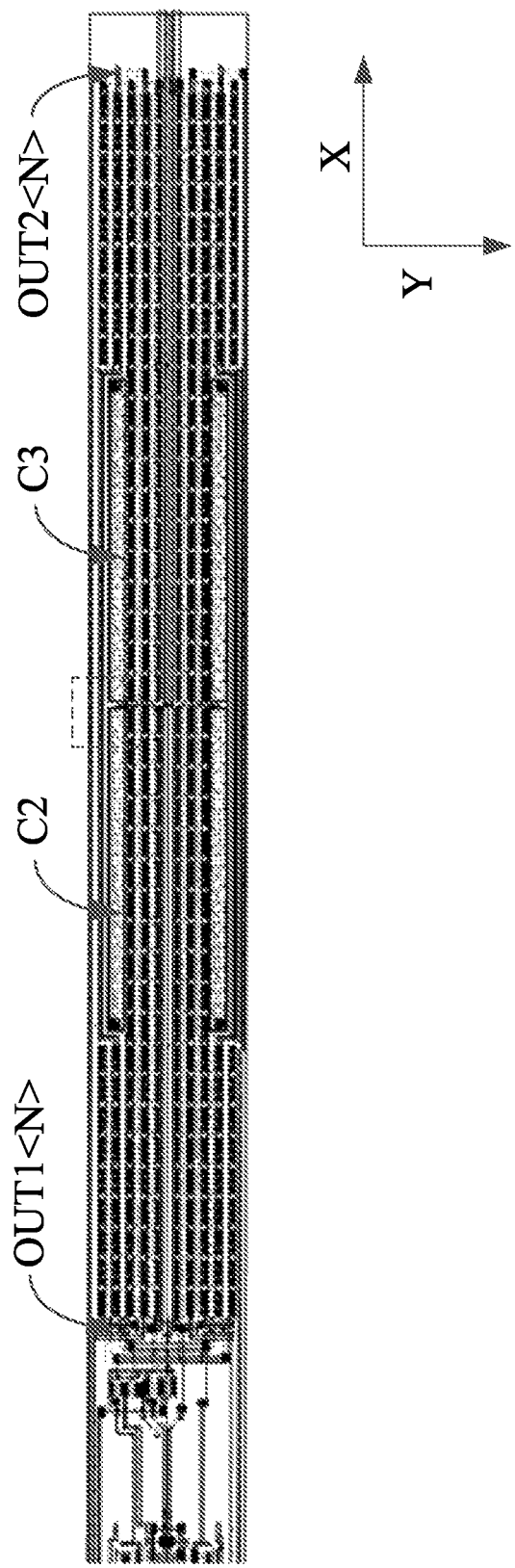
FIG. 11 is a schematic view showing a position relationship between output circuitries of two GOA units in the display substrate according to an embodiment of the present disclosure.

Further, as shown in FIG. 11, an outer contour of each capacitor in the GOA unit (i.e., the first capacitor C2 and the second capacitor C3 in FIG. 7) may be a rectangle, a lengthwise direction of the rectangle may be parallel to a row direction of the display substrate, a widthwise direction of the rectangle may be parallel to a column direction of the display substrate, and a ratio of a length of the rectangle to a width of the rectangle may be greater than 5.

In FIG. 11, an X-axis direction is the row direction of the display substrate, and a Y-axis direction is the column direction of the display substrate. When the ratio of the length to the width of the outer contour of the capacitor is greater than 5, it is able to reduce a space occupied by the capacitor in the column direction of the display substrate and provide more pixels in the column direction than otherwise, thereby to increase a resolution of a display device.

As shown in FIGS. 9, 10 and 11, there are two capacitors in the GOA unit, first long sides of the two capacitors may be located on a straight line, and second long sides of the two capacitors may be located on another straight line.

The first long sides of the two capacitors may be long sides above the capacitors in FIGS. 9 and 10, and the second long sides of the two capacitors may be long sides under the capacitors in FIGS. 9 and 10. The first long sides of the two capacitors may be located on a straight line, and second long sides of the two capacitors may be located on another straight line, i.e., the two capacitors may be flush with each other on the display substrate. In this regard, it is able to reduce the space occupied by the two capacitors in the column direction of the display substrate and provide more pixels in the column direction, thereby to increase the resolution of the display device.

FIG. 9 shows a region in a dotted box in FIG. 11 where the two capacitors adjoin each other, and the second conductive patterns of the first capacitor C2 and the second capacitor C3 may be the same second conductive pattern.

Further, as shown in FIG. 11, the output circuitries of two adjacent GOA units in the display substrate may be arranged symmetrically relative to a line extending in a direction parallel to the row direction of the display substrate.

FIG. 11 shows two GOA units arranged sequentially in the Y-axis direction. As shown in FIG. 11, the output circuitries of the two GOA units may be arranged symmetrically relative to a line extending in a direction parallel to the row direction of the display substrate, so as to facilitate the design of signal lines in the display substrate, thereby to improve the manufacture efficiency of the display substrate.

The present disclosure further provides in some embodiments a display device including the above-mentioned display substrate.

The display device may be a display, a mobile phone, a flat-panel computer, a television, a wearable electronic device or a navigator.

Figure 12:
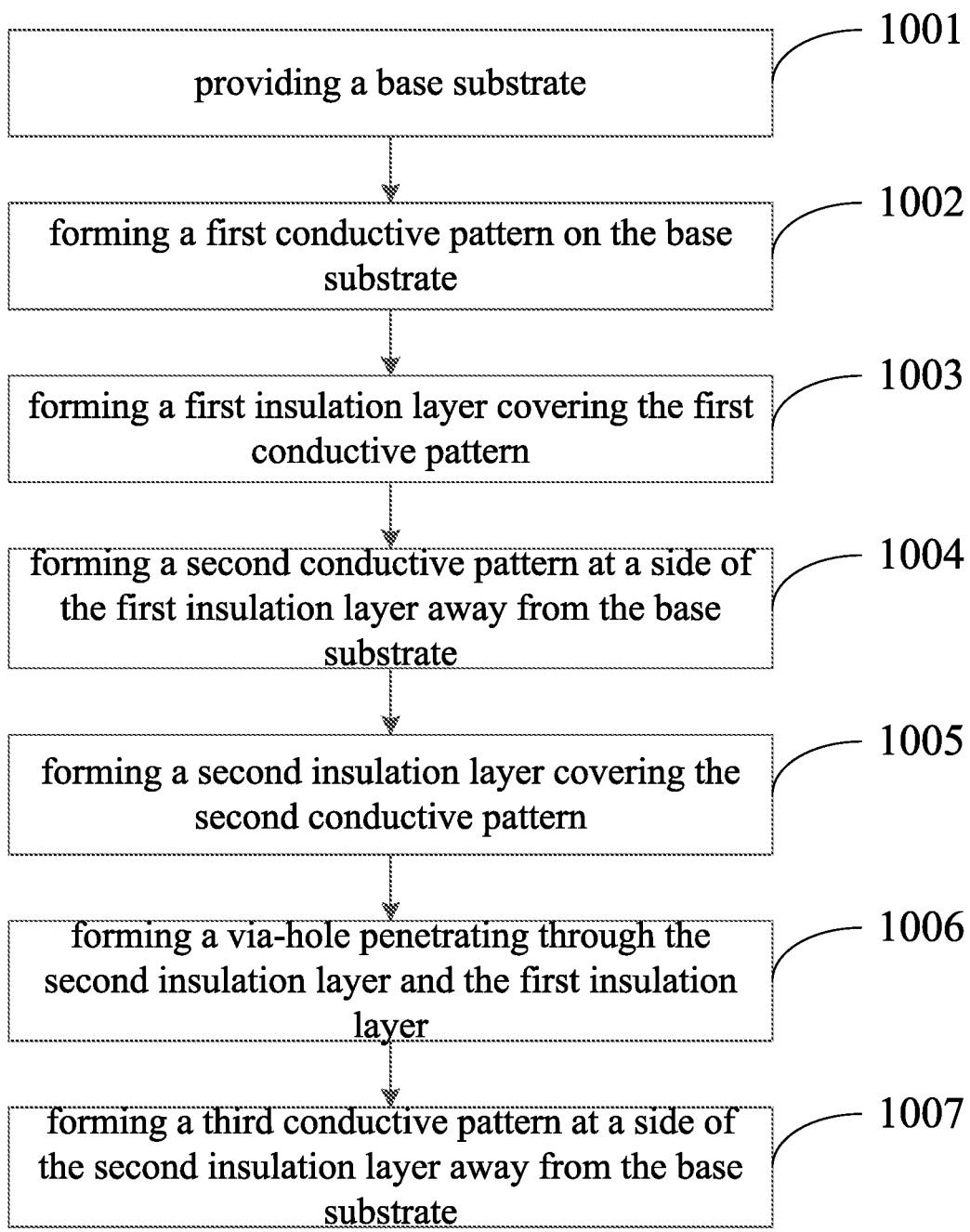
FIG. 12 is a flow chart of a method for manufacturing the display substrate according to an embodiment of the present disclosure.

The present disclosure further provides in some embodiments a method for manufacturing a display substrate which, as shown in FIG. 12, includes: Step 1001 of providing a base substrate; Step 1002 of forming a first conductive pattern on the base substrate, the first conductive pattern including a peripheral portion and a first portion and a second portion surrounded by the peripheral portion; Step 1003 of forming a first insulation layer covering the first conductive pattern; Step 1004 of forming a second conductive pattern at a side of the first insulation layer away from the base substrate, an orthogonal projection of the second conductive pattern onto the base substrate coinciding with an orthogonal projection of the first portion of the first conductive pattern onto the base substrate; Step 1005 of forming a second insulation layer covering the second conductive pattern; Step 1006 of forming a via-hole penetrating through the first insulation layer and the second insulation layer, an orthogonal projection of the via-hole onto the base substrate being located within an orthogonal projection of the second portion of the first conductive pattern onto the base substrate; and Step 1007 of forming a third conductive pattern at a side of the second insulation layer away from the base substrate, the third conductive pattern including a first portion and a second portion, an orthogonal projection of the first portion of the third conductive pattern onto the base substrate being located within the orthogonal projection of the second conductive pattern onto the base substrate, the second portion of the third conductive pattern covering the via-hole, and the third conductive pattern being electrically connected to the first conductive pattern through the via-hole.

According to the embodiments of the present disclosure, the orthogonal projection of the second conductive pattern onto the base substrate may coincide with the orthogonal projection of the first portion of the first conductive pattern surrounded by the peripheral portion onto the base substrate, so as to reduce the probability of an electrical connection between the second conductive pattern and the first conductive pattern when a gap occurs in the first insulation layer. Identically, the orthogonal projection of the first portion of the third conductive pattern onto the base substrate may be located within the orthogonal projection of the second conductive pattern onto the base substrate, so as to reduce the probability of an electrical connection between the third conductive pattern and the second conductive pattern when a gap occurs in the second insulation layer. As a result, it is able to improve the yield of the capacitor. In addition, the capacitor in the GOA unit is designed with three layers, so as to reduce a space occupied by the capacitor while ensuring a capacitance, thereby to reduce a layout space of the GOA unit. Hence, according to the embodiments of the present disclosure, it is able to improve the yield of the capacitor, reduce the space occupied by the capacitor, and reduce the layout space of the GOA unit.

The base substrate may be a rigid base substrate or flexible base substrate. When the base substrate is a rigid base substrate, it may be a quartz or glass substrate, and when the base substrate is a flexible base substrate, it may be a polyimide thin film.

In the embodiments of the present disclosure, the capacitor may be of a three-layer structure.

The first conductive pattern 120 may include the peripheral portion, the first portion and the second portion, as shown in FIG. 3. In FIG. 3, reference numeral 221 represents an orthogonal projection of the peripheral portion of the first conductive pattern 120 onto the base substrate, reference numeral 222 represents the orthogonal projection of the first portion of the first conductive pattern 120 onto the base substrate, and reference numeral 223 represents the orthogonal projection of the second portion of the first conductive pattern 120 onto the base substrate. The orthogonal projection of the second conductive pattern 140 onto the base substrate may coincide with the orthogonal projection 222 of the first portion of the first conductive pattern 120 onto the base substrate, so as to prevent the second conductive pattern 140 from being electrically connected to the first conductive pattern 120 through a gap in the first insulation layer 130 covering the peripheral portion of the first conductive pattern 120, thereby to prevent the failure of the capacitor.

The first conductive pattern 120 and the second conductive pattern 140 may each be made of a metal material, or any other conductive material. Here, a specific material of them will not be particularly defined.

The first insulation layer 130 may be made of an organic insulation material, or an inorganic insulation material. Here, a specific material of the first insulation layer 130 will not be particularly defined herein.

A contour of the orthogonal projection of the second conductive pattern 140 onto the base substrate is shown by a bold solid line in FIG. 4. The second conductive pattern 140 may not be in contact with the first insulation layer 130 through a bending gap at the peripheral portion, so it is able to prevent the second conductive pattern 140 from being electrically connected to the first conductive pattern 120 through the gap at a bending portion of the first insulation layer 130, thereby to ensure the insulation performance between the first conductive pattern 120 and the second conductive pattern 140, and improve the yield of the capacitor.

A contour of the orthogonal projection of the third conductive pattern 160 onto the base substrate is shown by a bold dotted line in FIG. 4.

The third conductive pattern 160 may include the first portion and the second portion. In FIG. 5, reference numeral 561 represents the orthogonal projection of the first portion of the third conductive pattern 160 onto the base substrate. The orthogonal projection of the first portion of the third conductive pattern 160 onto the base substrate may be located within the orthogonal projection of the second conductive pattern 140 onto the base substrate, so as to prevent the first portion of the third conductive pattern 160 from being electrically connected to the second conductive pattern 140 through a gap at a bending portion of the second insulation layer 150, thereby to ensure the insulation performance between the third conductive pattern 160 and the second conductive pattern 140, and improve the yield of the capacitor.

As shown in FIGS. 3 to 5, the orthogonal projection 562 of the second portion of the third conductive pattern 160 onto the base substrate may overlap the orthogonal projection 223 of the second portion of the first conductive pattern 120 onto the base substrate at the overlapping region. Hence, the third conductive pattern 160 may be electrically connected to the first conductive pattern 120 through a via-hole formed in the overlapping region and penetrating through the first insulation layer 130 and the second insulation layer 150.

The third conductive pattern 160 may be made of a metal material or any other conductive material. Here, a specific material of the third conductive pattern 160 will not be particularly defined herein.

The second insulation layer 150 may be made of an organic insulation material or an inorganic insulation material. Here, a specific material of the second insulation layer 150 will not be particularly defined herein.

The second conductive pattern 140 may be arranged in such a manner as to face the first portion of the third conductive pattern 160 and face the first portion of the first conductive pattern 120. Through applying voltages to the second conductive pattern 140 and the third conductive pattern 160 respectively, an internal electric field may be generated between the second conductive pattern 140 and the first portion of the third conductive pattern 160, so as to store charges. In addition, the third conductive pattern 160 may be electrically connected to the first conductive pattern 120, so an internal electric field may also be formed between the second conductive pattern 140 and the first portion of the first conductive pattern 120, so as to store charges.

The charges may be stored at both sides of the second conductive pattern 140, so it is able to reduce an area of the second conductive pattern 140 while ensuring a charge storage amount, thereby to reduce an area of the capacitor. In the embodiments of the present disclosure, the capacitor may be used for the GOA unit in the display substrate, so as to reduce the area of the capacitor in the GOA unit, thereby to reduce the layout space of the GOA unit.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display substrate, comprising:
a base substrate;
a first conductive pattern arranged on the base substrate and comprising a peripheral portion and a first portion and a second portion surrounded by the peripheral portion;
a first insulation layer arranged at a side of the first conductive pattern away from the base substrate and covering the first conductive pattern;
a second conductive pattern arranged at a side of the first insulation layer away from the base substrate, an orthogonal projection of the second conductive pattern onto the base substrate coinciding with an orthogonal projection of the first portion of the first conductive pattern onto the base substrate;
a second insulation layer arranged at a side of the second conductive pattern away from the base substrate and covering the second conductive pattern; and
a third conductive pattern arranged at a side of the second insulation layer away from the base substrate and comprising a first portion and a second portion, an orthogonal projection of the first portion of the third conductive pattern onto the base substrate being located within the orthogonal projection of the second conductive pattern onto the base substrate, an orthogonal projection of the second portion of the third conductive pattern onto the base substrate overlapping an orthogonal projection of the second portion of the first conductive pattern onto the base substrate at an overlapping region, and the third conductive pattern being electrically connected to the first conductive pattern through a via-hole at the overlapping region,
wherein the first conductive pattern, the first insulation layer, the second conductive pattern, the second insulation layer and the third conductive pattern together form a capacitor of a Gate Driver on Array (GOA) unit in the display substrate; and
the third conductive pattern and the first conductive pattern together serve as a first electrode plate of the capacitor, and the second conductive pattern serves as a second electrode plate of the capacitor;
wherein an output circuitry of the GOA unit comprises an output transistor and the capacitor, a control electrode of the output transistor is connected to a pull-up node, a first electrode of the output transistor is connected to a driving signal source, a second electrode of the output transistor is connected to a pixel driving circuitry, the first electrode plate of the capacitor is connected to the control electrode of the output transistor, the second electrode plate of the capacitor is connected to the second electrode of the output transistor, and the output transistor is configured to output a driving signal to the pixel driving circuitry under the control of a potential of a pull-up signal;
wherein the GOA unit further comprises a noise reduction circuitry, a first end of which is connected to an output end of the output circuitry and a second end of which is connected to a low level signal line, wherein the noise reduction circuitry is configured to pull down a potential at the output end of the output circuitry under the control of a potential at a pull-down node to reduce a noise;
wherein the noise reduction circuitry comprises a first noise reduction transistor and a second noise reduction transistor, the first noise reduction transistor is configured to pull down a potential at the output end of the output circuitry under the control of a first pull-down signal, the second noise reduction transistor is configured to pull down the potential at the output end of the output circuitry under the control of a second pull-down signal, the first pull-down signal and the second pull-down signal are outputted alternately.

2. The display substrate according to claim 1, wherein the third conductive pattern is made of a metal material.

3. The display substrate according to claim 1, further comprising a light-shielding layer made of a conductive material, and wherein the light-shielding layer and the first conductive pattern are in a same layer and made of a same material.

4. The display substrate according to claim 1, further comprising a thin film transistor (TFT) array layer, wherein a gate electrode in the TFT array layer and the second conductive pattern are in a same layer and made of a same material.

5. The display substrate according to claim 1, wherein the GOA unit comprises at least two output circuitries, and the second conductive patterns of the capacitors in the at least two output circuitries are the same.

6. The display substrate according to claim 1, wherein an outer contour of the capacitor in the GOA unit is a rectangle, a lengthwise direction of the rectangle is parallel to a row direction of the display substrate, a widthwise direction of the rectangle is parallel to a column direction of the display substrate, and a ratio of a length of the rectangle to a width of the rectangle is greater than 5.

7. The display substrate according to claim 6, wherein the GOA unit comprises two capacitors, first long sides of the two capacitors are located on a straight line, and second long sides of the two capacitors are located on another straight line.

8. The display substrate according to claim 1, wherein the output circuitries of two adjacent GOA units in the display substrate are arranged symmetrically relative to a line extending in a direction parallel to the row direction of the display substrate.

9. A display device, comprising a display substrate, the display substrate comprising:
a base substrate;
a first conductive pattern arranged on the base substrate and comprising a peripheral portion and a first portion and a second portion surrounded by the peripheral portion;
a first insulation layer arranged at a side of the first conductive pattern away from the base substrate and covering the first conductive pattern;
a second conductive pattern arranged at a side of the first insulation layer away from the base substrate, an orthogonal projection of the second conductive pattern onto the base substrate coinciding with an orthogonal projection of the first portion of the first conductive pattern onto the base substrate;
a second insulation layer arranged at a side of the second conductive pattern away from the base substrate and covering the second conductive pattern; and
a third conductive pattern arranged at a side of the second insulation layer away from the base substrate and comprising a first portion and a second portion, an orthogonal projection of the first portion of the third conductive pattern onto the base substrate being located within the orthogonal projection of the second conductive pattern onto the base substrate, an orthogonal projection of the second portion of the third conductive pattern onto the base substrate overlapping an orthogonal projection of the second portion of the first conductive pattern onto the base substrate at an overlapping region, and the third conductive pattern being electrically connected to the first conductive pattern through a via-hole at the overlapping region,
wherein the first conductive pattern, the first insulation layer, the second conductive pattern, the second insulation layer and the third conductive pattern together form a capacitor of a Gate Driver on Array (GOA) unit in the display substrate; and
the third conductive pattern and the first conductive pattern together serve as a first electrode plate of the capacitor, and the second conductive pattern serves as a second electrode plate of the capacitor;
wherein an output circuitry of the GOA unit comprises an output transistor and the capacitor, a control electrode of the output transistor is connected to a pull-up node, a first electrode of the output transistor is connected to a driving signal source, a second electrode of the output transistor is connected to a pixel driving circuitry, the first electrode plate of the capacitor is connected to the control electrode of the output transistor, the second electrode plate of the capacitor is connected to the second electrode of the output transistor, and the output transistor is configured to output a driving signal to the pixel driving circuitry under the control of a potential of a pull-up signal;
wherein the GOA unit further comprises a noise reduction circuitry, a first end of which is connected to an output end of the output circuitry and a second end of which is connected to a low level signal line, wherein the noise reduction circuitry is configured to pull down a potential at the output end of the output circuitry under the control of a potential at a pull-down node to reduce a noise;
wherein the noise reduction circuitry comprises a first noise reduction transistor and a second noise reduction transistor, the first noise reduction transistor is configured to pull down a potential at the output end of the output circuitry under the control of a first pull-down signal, the second noise reduction transistor is configured to pull down the potential at the output end of the output circuitry under the control of a second pull-down signal, the first pull-down signal and the second pull-down signal are outputted alternately.

10. A method for manufacturing a display substrate, comprising:
providing a base substrate;
forming a first conductive pattern on the base substrate, the first conductive pattern comprising a peripheral portion and a first portion and a second portion surrounded by the peripheral portion;
forming a first insulation layer covering the first conductive pattern;
forming a second conductive pattern at a side of the first insulation layer away from the base substrate, an orthogonal projection of the second conductive pattern onto the base substrate coinciding with an orthogonal projection of the first portion of the first conductive pattern onto the base substrate;
forming a second insulation layer covering the second conductive pattern;
forming a via-hole penetrating through the first insulation layer and the second insulation layer, an orthogonal projection of the via-hole onto the base substrate being located within an orthogonal projection of the second portion of the first conductive pattern onto the base substrate; and
forming a third conductive pattern at a side of the second insulation layer away from the base substrate, the third conductive pattern comprising a first portion and a second portion, an orthogonal projection of the first portion of the third conductive pattern onto the base substrate being located within the orthogonal projection of the second conductive pattern onto the base substrate, the second portion of the third conductive pattern covering the via-hole, and the third conductive pattern being electrically connected to the first conductive pattern through the via-hole;
wherein the first conductive pattern, the first insulation layer, the second conductive pattern, the second insulation layer and the third conductive pattern together form a capacitor of a Gate Driver on Array (GOA) unit in the display substrate; and
the third conductive pattern and the first conductive pattern together serve as a first electrode plate of the capacitor, and the second conductive pattern serves as a second electrode late of the capacitor;
wherein an output circuitry of the GOA unit comprises an output transistor and the capacitor, a control electrode of the output transistor is connected to a pull-up node, a first electrode of the output transistor is connected to a driving signal source, a second electrode of the output transistor is connected to a pixel driving circuitry, the first electrode plate of the capacitor is connected to the control electrode of the output transistor, the second electrode plate of the capacitor is connected to the second electrode of the output transistor, and the output transistor is configured to output a driving signal to the pixel driving circuitry under the control of a potential of a pull-up signal;
wherein the GOA unit further comprises a noise reduction circuitry, a first end of which is connected to an output end of the output circuitry and a second end of which is connected to a low level signal line, wherein the noise reduction circuitry is configured to pull down a potential at the output end of the output circuitry under the control of a potential at a pull-down node to reduce a noise;

wherein the noise reduction circuitry comprises a first noise reduction transistor and a second noise reduction transistor, the first noise reduction transistor is configured to pull down a potential at the output end of the output circuitry under the control of a first pull-down signal, the second noise reduction transistor is configured to pull down the potential at the output end of the output circuitry under the control of a second pull-down signal, the first pull-down signal and the second pull-down signal are outputted alternately.

11. The display device according to claim 9, wherein the third conductive pattern is made of a metal material.

12. The display device according to claim 9, wherein the display substrate further comprises a light-shielding layer made of a conductive material, and wherein the light-shielding layer and the first conductive pattern are in a same layer and made of a same material.

13. The display device according to claim 9, wherein the display substrate further comprises a thin film transistor (TFT) array layer, wherein a gate electrode in the TFT array layer and the second conductive pattern are in a same layer and made of a same material.

14. The display device according to claim 9, wherein the GOA unit comprises at least two output circuitries, and the second conductive patterns of the capacitors in the at least two output circuitries are the same.

15. The display device according to claim 9, wherein an outer contour of the capacitor in the GOA unit is a rectangle, a lengthwise direction of the rectangle is parallel to a row direction of the display substrate, a widthwise direction of the rectangle is parallel to a column direction of the display substrate, and a ratio of a length of the rectangle to a width of the rectangle is greater than 5.

16. The display device according to claim 9, wherein the output circuitries of two adjacent GOA units in the display substrate are arranged symmetrically relative to a line extending in a direction parallel to the row direction of the display substrate.

17. The display device according to claim 15, wherein the GOA unit comprises two capacitors, first long sides of the two capacitors are located on a straight line, and second long sides of the two capacitors are located on another straight line.

* * * * *